United States Patent
Han et al.

(10) Patent No.: US 7,484,144 B2
(45) Date of Patent: Jan. 27, 2009

(54) TESTING EMBEDDED MEMORY IN AN INTEGRATED CIRCUIT

(75) Inventors: Wei Han, Beaverton, OR (US); Loren McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 568 days.

(21) Appl. No.: 10/929,199

(22) Filed: Aug. 30, 2004

(65) Prior Publication Data

US 2006/0059386 A1 Mar. 16, 2006

(51) Int. Cl.
*G11C 29/00* (2006.01)
*G11C 7/00* (2006.01)
*G06F 11/00* (2006.01)

(52) U.S. Cl. .................. 714/719; 714/735; 365/201
(58) Field of Classification Search .............. None
See application file for complete search history.

(56) References Cited

U.S. PATENT DOCUMENTS

| | | | | |
|---|---|---|---|---|
| 5,075,892 A | * | 12/1991 | Choy | 714/719 |
| 5,757,809 A | * | 5/1998 | Kiso et al. | 714/718 |
| 6,141,779 A | * | 10/2000 | Hill et al. | 714/710 |
| 6,560,740 B1 | * | 5/2003 | Zuraski et al. | 714/733 |

* cited by examiner

*Primary Examiner*—Christine T Tu

(57) ABSTRACT

An integrated circuit includes a first bus and at least one array of embedded memories. Each array includes a second bus such as a bidirectional bus coupled to the embedded memories and to the first bus such that test vectors in the form of data words can be written from the first bus to selected embedded memories in the array. Also included is a built-in-self-test (BIST) circuit operable to compare data words on the first bus to data words read back from the selected embedded memories through the bidirectional bus.

14 Claims, 3 Drawing Sheets

TESTING EMBEDDED MEMORY IN AN INTEGRATED CIRCUIT

TECHNICAL FIELD

The present invention relates generally to integrated circuits having embedded memories, and more particularly to the testing of such embedded memories.

BACKGROUND

High-density modern semiconductor processes allow designers to shrink what would have been a board-level system into just a single system-on-a-chip (SOC) integrated circuit. As part of this integration, memories that would have existed as separate integrated circuits become embedded memories within a SOC. Although the resulting integration provides a very compact design, the testing of SOCs becomes more and more challenging as the number of integrated components rises. This testing may be classified into two categories, namely that of testing logic and testing memory. Testing embedded memories, such as SRAM's, is more difficult than testing dedicated memory chips because of the relative inaccessibility of the embedded memory. This testing difficulty manifests itself in several ways, such as in memory writing, memory reading, and the memory data path width to the input/output (IO) facilities of the integrated circuit. Should the embedded memories be used as read-only memory (ROM), a user will also need to configure the memories before operation of the integrated circuit. The need to configure and test embedded memories exacerbates the already considerable die area demands of embedded memories.

Conventional approaches to satisfy the need to both configure and test embedded memories have included the use of a row and column signal for each row and column address within each embedded memory within an integrated circuit. Such an approach becomes prohibitive as the number and size of the embedded memories is increased within each integrated circuit. Moreover, as the storage size of embedded memories is increased, the testing time is often increased exponentially.

Accordingly, there is a need in the art for improved testing and configuration capabilities for embedded memories.

SUMMARY

In accordance with one aspect of the invention, an integrated circuit is provided that includes: a first bus; and at least one array of embedded memories, each array including a bidirectional data bus coupled to the array of embedded memories and to the first bus such that test vectors may be written from the first bus to selected embedded memories in the array through the bidirectional data bus; and a test circuit configured to compare test vectors on the first bus to test vectors read back from the selected embedded memories in the array through the bidirectional data bus to provide a comparison result.

In accordance with another aspect of the invention, a method of testing embedded memories in an integrated circuit is provided that includes the acts of: writing a test vector from a first bus through a second bus to an embedded memory selected from a plurality of embedded memories; electrically isolating the first bus from the second bus; reading the test vector from the embedded memory through the second bus; and comparing the test vector read from the embedded memory to the test vector on the first bus to provide a comparison result.

In accordance with another aspect of the invention, an integrated circuit is provided that includes: a directional bus; and a plurality of arrays of embedded memories, each array including a bidirectional data bus coupled to the array of embedded memories and to the directional bus such that data words may be written from the directional bus to selected embedded memories in the array; and means for comparing data words on the directional bus to data words read back from the selected embedded memories in the array through the bidirectional data bus to provide a comparison result.

DETAILED DESCRIPTION

Figure 1:
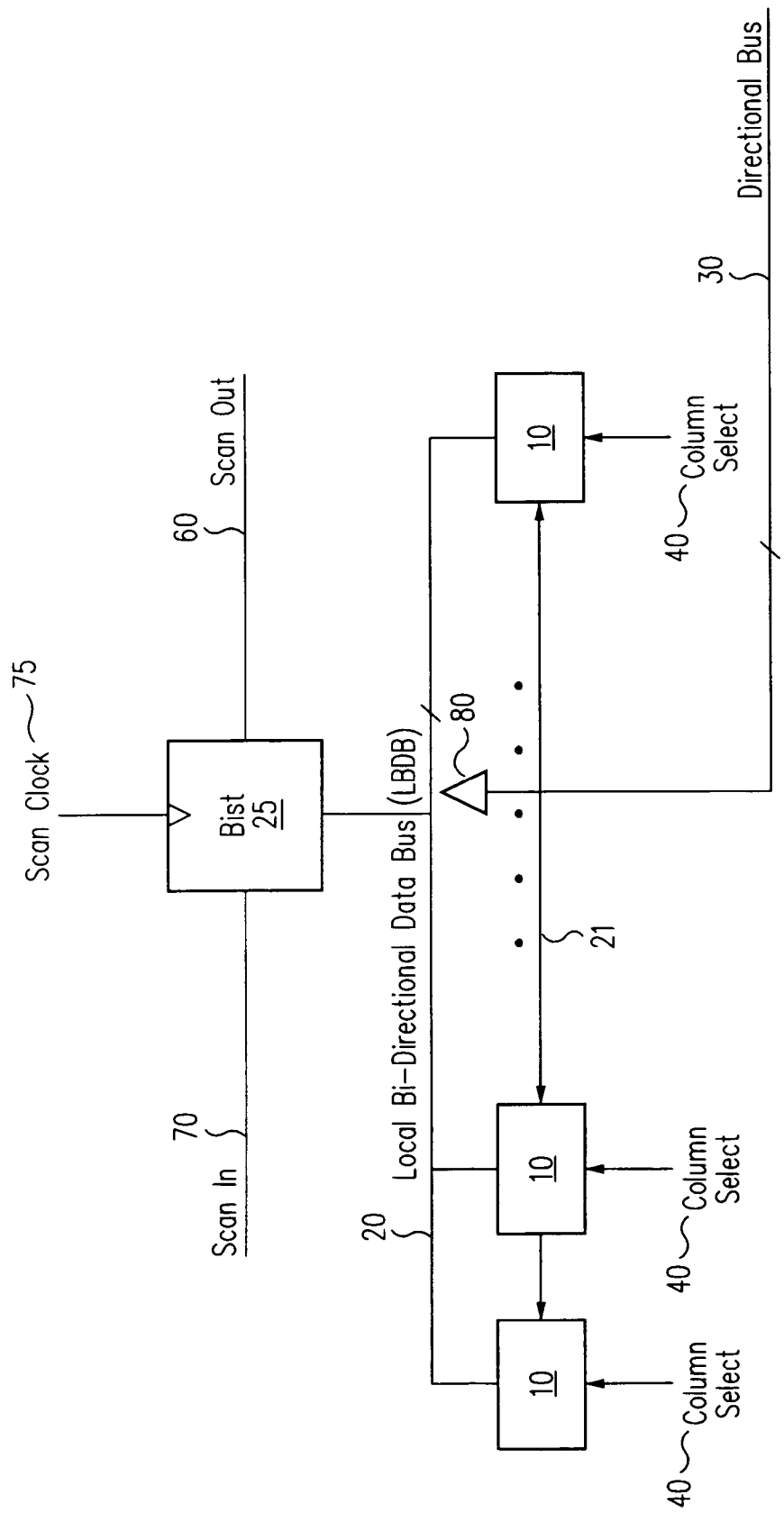
FIG. 1 is a block diagram of an embedded memory array in accordance with one embodiment of the invention.

The present invention provides a testing and configuration architecture for embedded memories. To reduce the die area demands of this approach, a number of embedded memories share a local bidirectional data bus (LBDB). Turning now to the drawings, an array of embedded memories 10 couple to a LBDB 20 as shown in FIG. 1. LBDB 20 connects the data paths of the embedded memory blocks with a built-in-self-test (BIST) circuit 25. A directional bus 30 couples testing and initialization signals to BIST circuit 25 and LBDB 20. Advantageously, because embedded memories 10 share local bidirectional data bus 20, a substantial saving in chip space is obtained as compared to testing architectures wherein each embedded memory has its own dedicated data bus.

To verify embedded memory function, test vectors in the form of data words are written to each embedded memory 10 in the array. As known in the art, the test vectors must be such that each memory location in embedded memories 10 can be shown to store both a logical one and a logical zero. The data width for a data bus (discussed with respect to FIG. 2) within directional bus 30 will typically match the data width for local bidirectional data bus 20. For example, if the word size for embedded memories 10 is one byte (eight bits), wherein a parity bit is associated with each one-byte word, the data width for both local bidirectional data bus 20 and the data bus within direction bus 30 would be nine bits.

Regardless of the data widths implemented in busses 20 and 30, test vectors are coupled from directional bus 30 to local bidirectional data bus 20 during initialization and testing. For example, a data word (and any associated parity bit or bits) may couple from directional bus 30 to local bidirectional data bus 20. Because local bidirectional data bus 20 is shared by all the embedded memories 10 that couple to data bus 20, each of these embedded memories may receive this data word. In other words, during testing, the various test vectors are broadcast to all memories 10. To allow addressing such that the broadcast word is written to a particular memory 10, each embedded memory 10 receives an address signal such as a column select signal 40. In this regard, it may be observed that two forms of addressing are used. A local address is coupled from directional bus 30 to LBDB 20 for addressing within each embedded memory 10. For example, if the word depth of each embedded memory 10 is 2K, then the local address would be eleven bits wide. In addition to the local address, LBDB 20 may also couple other control signals such as a clock signal and a write enable signal. The local address and the associated control signals are coupled to embedded memories 10 from directional bus 30 over a local embedded memory bus (EMB) 21. Unlike LBDB 20, local embedded memory bus 21 may be a directional bus. During a write operation, all embedded memories 10 will receive the data word and its associated local address and control signals that are being broadcast over LBDB 20 and local EMB 21. However, the global addressing (in contrast to the local addressing being carried over local EMB 21) provided by column select signals 40 ensures that the broadcast data word is written to the local address in the appropriate embedded memory 10. In other words, only the embedded memory 10 indicated by the global addressing responds to the local address. The global address signals such as column select signals 40 may be carried over directional bus 30 or be carried on their own dedicated path.

Once an embedded memory 10 has been configured with the appropriate test vectors (data words), its operation is verified by reading back the test vectors and comparing them to the test vectors as written in BIST circuit 25. For increased verification speed, the results of each test vector/data word comparison may be collapsed or accumulated into one or more scan data out bits 60. For example, BIST circuit 25 may exclusive OR (XOR) each retrieved data word with the originally written data word. If any bit within the retrieved data word does not match the corresponding bit in the originally written data word, the XOR result will be a logical one, indicating an error in that retrieved data word. As will be explained further with respect to FIG. 3, multiple groups of embedded memories may be provided within each integrated circuit, wherein each group of embedded memories has its own local bidirectional data bus 20 and BIST circuit 25 as discussed with respect to FIG. 1. The retrieved scan data bits may thus form a scan chain across the multiple groups analogous to a JTAG scan chain. Scan bits from a neighboring group may then be received by a particular BIST circuit 25 as scan data in bits 70 as seen in FIG. 1. A scan clock 75 would coordinate the transfer of scan data in bits 70 through BIST circuit 25 as well as the transfer of scan data out bits 60.

To perform the comparison of a written data word (test vector) with the originally written data word, BIST circuit 25 receives the originally written data word from directional data bus 30 as will be explained further with respect to FIG. 2. However, this data word being carried on directional data bus 30 must be prevented from polluting the results of the corresponding data word being retrieved from an embedded memory 10 over LBDB 20. Thus, a tri-state buffer 80 may be used to isolate the data busses 20 and 30 during verification of embedded memories 10 as will be explained further with respect to FIG. 2.

Figure 2:
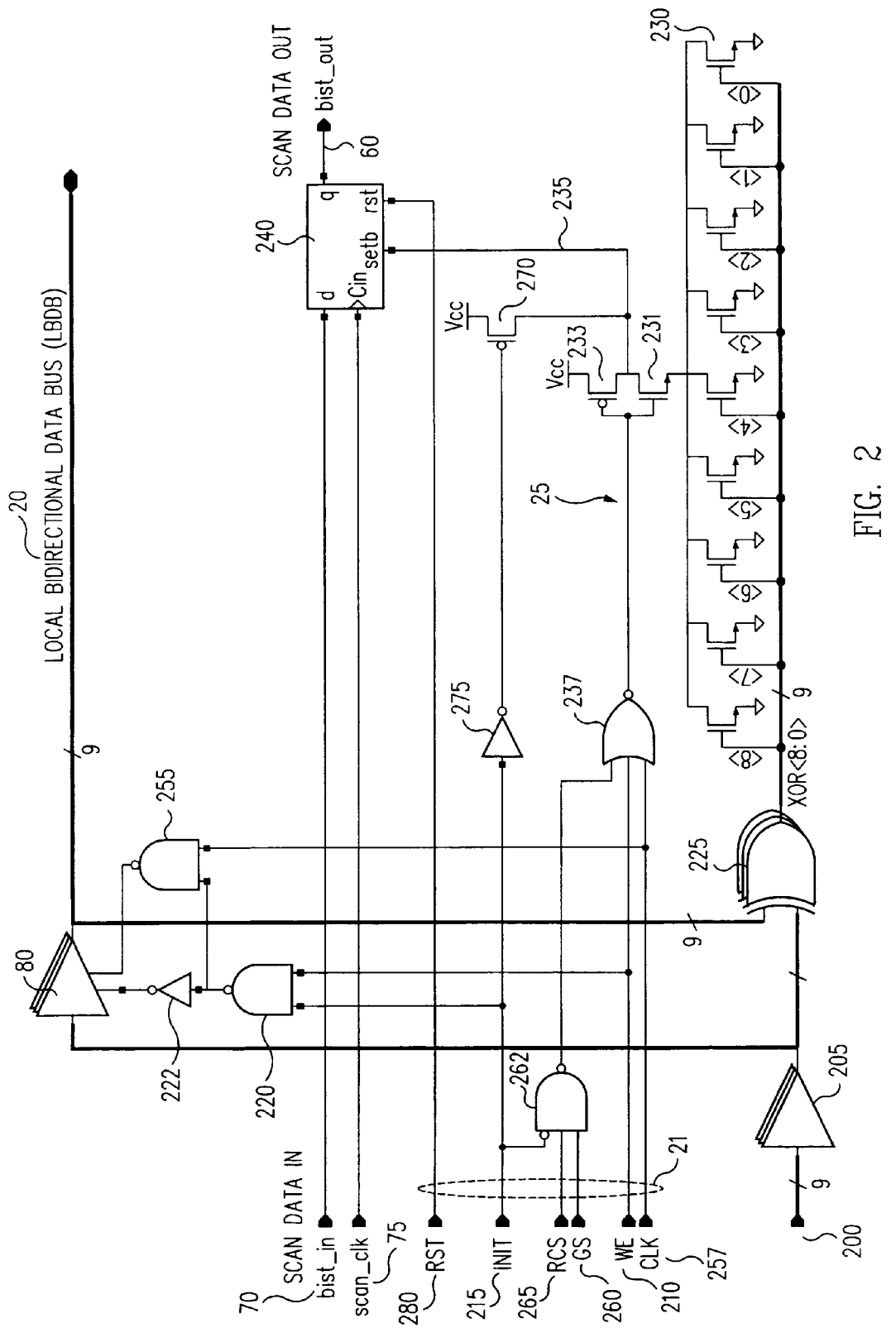
FIG. 2 is a schematic illustration of a built-in-self-test (BIST) circuit for the embedded memory array of FIG. 1.

Turning now to FIG. 2, an exemplary embodiment for BIST circuit 25 is shown. In this embodiment, directional bus 30 (FIG. 1) includes a data bus 200 that is 9 bits wide. As discussed previously, such a data width would be appropriate for embedded memories 10 configured to store words one byte in width, wherein each stored word is associated with a parity bit. However, it will be appreciated that the present invention is widely applicable to the testing and initialization of embedded memories, regardless of the embedded memories' word width and whether the stored words are associated with metadata such as parity bits. After being buffered through buffers 205, data words carried on data bus 200 may couple to local bidirectional data bus 20 during a write operation to embedded memory blocks 10 (FIG. 1). To verify that an embedded memory correctly stored the desired word, it is read back from the embedded memory and compared to the original data word carried on data bus 200 in BIST circuit 25. Clearly, such a verify operation will not work if the original data word couples to local bidirectional data bus 20 from data bus 200 as it did during the write operation. Thus, data bus 200 couples to local bidirectional data bus 20 through tri-state buffers 80 as discussed with respect to FIG. 1. During a verify operation, tri-state buffers 80 are placed into a high impedance mode so that data words carried on data bus 200 do not affect the words being read back from embedded memories 10 over local bidirectional data bus 20. It will be appreciated that the control of whether tri-state buffers 80 are in the high-impedance mode may be accomplished many different ways. For example, as shown in FIG. 2, a write enable signal 210 and an initialization signal 215 are received by a NAND gate 220. In turn, NAND gate 220 drives an inverter 222 that controls tri-state buffers 80. Thus, should write enable signal 210 and initialization signal 215 be asserted low, tri-state buffers 80 are driven into the high-impedance mode so that a verify operation may take place. Conversely, should write enable signal 210 and/or initialization signal 215 be asserted high, tri-state buffers 80 will be placed into the low-impedance mode. For example, write enable signal 210 would be asserted high so that a data word may couple through tri-state buffers 80 from data bus 200 to be written to an embedded memory over local bidirectional data bus 20.

A simple logic operation to verify a retrieved data word coupled from an embedded memory over local bidirectional data bus 20 would be an exclusive OR (XOR) operation with the original data words. Thus, BIST circuit 25 may include XOR gates 225 to compare a retrieved data word coupled from bidirectional data bus 20 to the originally written data word coupled from data bus 200. In the embodiment illustrated, the data width of busses 200 and 20 is nine bits. XOR gates 225 compare each bit carried on data bus 200 with the corresponding bit carried on local bidirectional data bus 20. The output word from XOR gates 225 may thus be designated as XOR<8:0>. Each bit in output word XOR<8:0> controls a corresponding NMOS transistor 230. Should any bit in the retrieved data word from local bidirectional data bus not match the corresponding bit in the original data word, the corresponding bit in XOR<8:0> will be asserted high. In turn, the corresponding NMOS transistor 230 will become conductive. The drains of NMOS transistors 230 couple to a source of an additional NMOS transistor 231 such that if any one of NMOS transistors 230 becomes conductive, the source of transistor 231 is pulled towards ground.

The drain of transistor 231 couples to the drain of a PMOS transistor 233. PMOS transistor 233 is configured such that it will weakly pull up a lead 235 towards VCC when PMOS transistor 233 is conducting. A NOR gate 237 controls both transistors 233 and 231. Thus, should NOR gate 237 assert its output, PMOS transistor 233 turns off and NMOS transistor 231 turns on. If none of transistors 230 are then conductive, lead 235 floats. However, should the retrieved data word being verified have one or more bit errors, lead 235 is pulled towards ground such that transistors 230 perform an wired NOR function on the output of XOR gates 225. A scan register 240 receives lead 235 at its $\overline{\text{SET}}$ input. Thus, should lead 235 be pulled towards ground, the Q signal for scan register 240 is asserted high. Scan register 240 outputs its Q signal as scan data out 60. It will be appreciated that BIST circuit 25 may be easily modified to process data words of an arbitrary data width. Regardless of the data width, however, the verification result may be accumulated into a single bit output (such as scan data out 60), thereby alleviating die size demands with respect to bussing out each individual bit comparison result for each retrieved data word. The tradeoff is that a user then has no way of knowing which bits were faulty in a retrieved data word. Should a user be willing to accept the die size demands, these faulty bits may be identified by supplying a scan register for each bit.

In the embodiment illustrated in FIG. 2, local bidirectional data bus 20 includes a keeper circuit such as a PMOS transistor (not illustrated) that acts to softly pull local bidirectional data bus to VCC when data words are read back from embedded memories 10 over local bidirectional data bus 20. The test overhead for embedded memories 10 may be simplified in such an embodiment because the state of local bidirectional data bus 20 need be changed for just one binary state (high or low). For example, if the retrieval of a logical zero memory bit from an embedded memory 10 is designated by pulling the corresponding trace on local bidirectional data bus 20 to ground, nothing need be done to retrieve a logical one in that bus 20 has already been pulled softly to VCC. A NAND gate 255 controls the keeper circuit for local bidirectional data bus 20. In turn, NAND gate 255 is controlled by the output of NAND gate 220 and an EMB clock signal 257. In this fashion, the soft pullup of LBDB 20 is turned off during a write operation in response to the assertion of the write enable signal, which brings the output of NAND gate 220 low.

Figure 3:
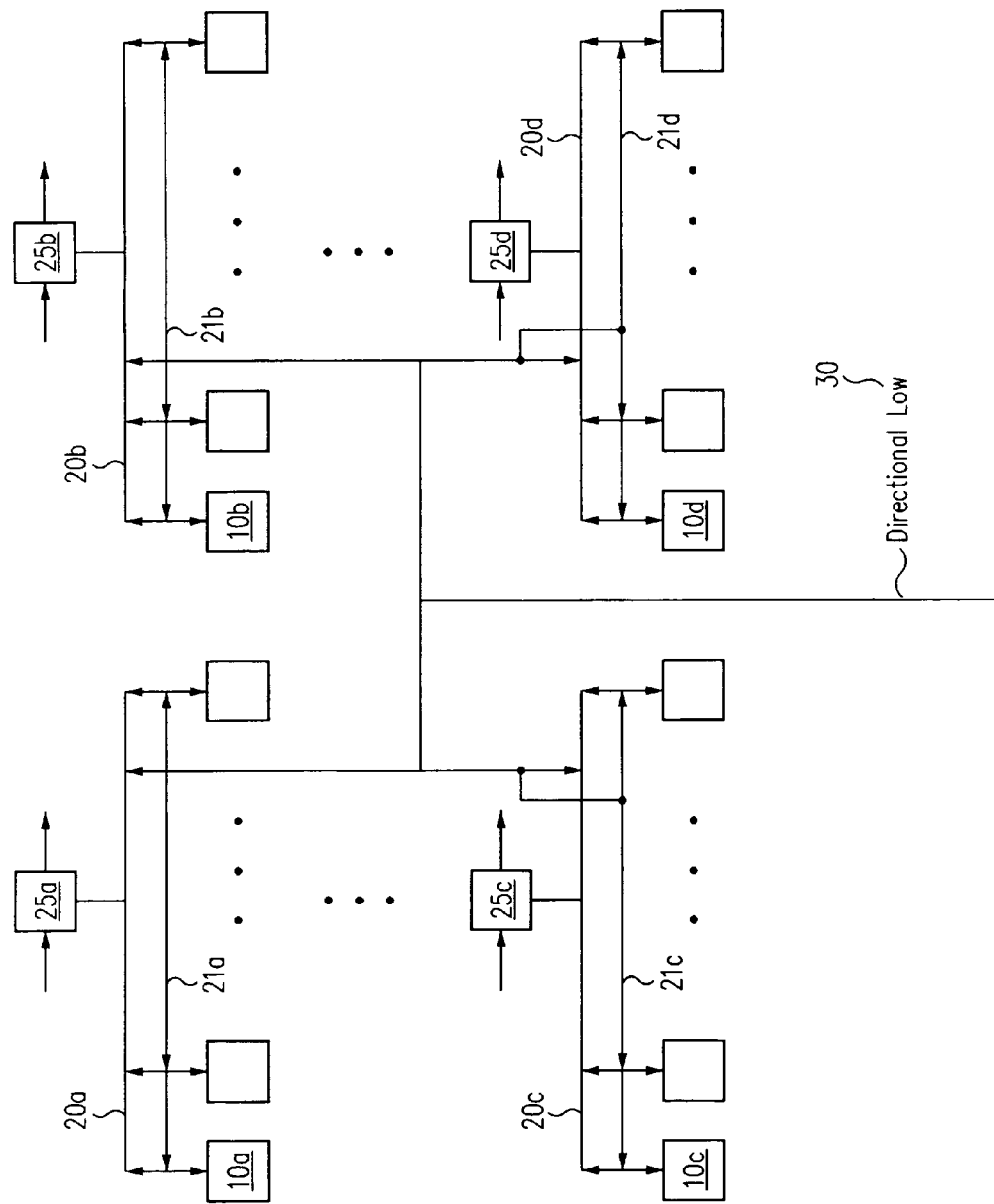
FIG. 3 is a block diagram of an integrated circuit including a plurality of arrays of embedded memories according to one embodiment of the invention.

The embedded memory BIST architecture discussed with respect to FIGS. 1 and 2 may be repeated for multiple arrays of embedded memories, each array being associated with its own local bidirectional data bus, local embedded memory bus, and BIST circuit. For example, as seen in FIG. 3, directional bus 30 may couple to a number of local bidirectional data busses and their associated local embedded memory busses. For illustration clarity, only four bidirectional data busses 20a, 20b, 20c, and 20d and the associated embedded memory busses 21a, 21b, 21c, and 21d are depicted. Each bidirectional data bus and local embedded memory bus supplies its own array of embedded memories. For example, bidirectional data bus 20a couples to embedded memories 10a and BIST circuit 25a as discussed with respect to FIGS. 1 and 2. A scan chain couples through each BIST circuit so that the verification results may be shifted out analogously to the well-known boundary scan technique (JTAG). For example, referring back to FIG. 2, scan data out signal 60 corresponding to the verification results for a retrieved data word on one local bidirectional data bus may be shifted in as a scan data in signal 70 for the BIST circuit for another local bidirectional data bus. Each scan register 240 receives its scan data in signal 70 as its D input, which may then be clocked out as scan data out signal 60 responsive to cycles of scan clock 75.

To avoid glitches on the $\overline{\text{SET}}$ input for scan register 240, NOR gate 237 will not assert its output unless both EMB clock 257 and write enable 210 are low. Referring again to FIG. 3, it may be seen that the global addressing (selection of a particular embedded memory) may be performed with row and column address signals. These address signals may be carried on local EMBs 21 or carried on separate paths. In addition, a group addressing scheme may also be performed to select just those embedded memories associated with a particular LBDB 20. For example, as seen in FIG. 2, a group select signal 260 is received by a NAND gate 262 in addition to a global row address signal 265. During a verify operation for a given embedded memory, the corresponding global row address and group select signals will be asserted. NAND gate 262 also receives an inverse of initialization signal 215. Thus, during a verify operation for an embedded memory coupled to the corresponding LBDB 20, the output of NAND gate 262 will be low. NOR gate 237 also receives the output of NAND gate 262 in addition to write enable signal 210 and EMB clock 257. Accordingly, only when all three of these signals are low will the output of NOR gate 237 be asserted to allow the wired NOR operation provided by transistors 230 to proceed with respect to the output of XOR gates 225. In this fashion, sufficient glitch protection is provided so that a scanned result carried on scan data in 70 is not corrupted as it is shifted through scan register 240. A strong p-channel pullup transistor 270 also couples to lead 235. After being inverted through an inverter 275, initialization signal 215 controls transistor 270 so that lead 235 may be strongly pulled to VCC when initialization signal 215 is asserted. Scan register 240 may also be reset by a reset signal 280 carried on local EMB 21.

A test algorithm for an integrated circuit having the embedded memory BIST architecture shown in FIG. 3 may proceed as follows. After assertion of the initialization signal 215, a data stream may be provided by an external source such as a JTAG source or a processor. Alternatively, the data stream may be generated by the integrated circuit itself. Through a global addressing scheme such as through column select signals 40 and row select signals 265, each embedded memory may be addressed serially so that the desired data words (test vectors) are written. Alternatively, a parallel selection may be performed such that multiple embedded memories are written to at the same time. Having been globally addressed, the selected embedded memory receives the desired data word at the desired local address. As discussed above, the local address is simply the storage location within each embedded memory and may be broadcast to all embedded memories at once. However, only the embedded memory selected by the global addressing scheme will respond to the local address.

Once the embedded memories have been initialized with the desired test vectors, their contents may be verified. The data words are again provided by either the internal or external source. Should common test vectors have been used for the embedded memories, multiple embedded memories may be selected, using both the global addressing scheme and the group addressing scheme such as group address signal 260. Once the appropriate scan registers have provided their scan signals 60, the results may be shifted out responsive to cycles of scan clock 75. Those of ordinary skill in the art will appreciate that the embedded memory initialization and testing architecture described with respect to FIGS. 1 through 3 may be implemented in numerous alternative embodiments. For example, the local bidirectional data busses need not include a keeper circuit. Moreover, the logic and the corresponding control signals for the tri-state buffers and the BIST circuit may also be altered. Accordingly, the above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention

We claim:

1. An integrated circuit, comprising:
   a first bus;
   at least one array of embedded memories;
   a bidirectional data bus coupled to the array of embedded memories and to the first bus such that test vectors may be written from the first bus to selected embedded memories in the array through the bidirectional data bus;
   a test circuit adapted to compare test vectors on the first bus to test vectors read back from the selected embedded memories in the array through the bidirectional data bus to provide a comparison result; and a tri-state buffer coupled between the first bus and the bidirectional bus, the tri-state buffer adapted to being driven into a high-impedance mode while test vectors are read back from the embedded memories.

2. The integrated circuit of claim 1, wherein the first bus is a directional bus.

3. The integrated circuit of claim 1 including a plurality of arrays of embedded memories, wherein each array includes a separate test circuit.

4. The integrated circuit of claim 3, wherein each array includes a built-in-self-test (BIST) circuit and each BIST circuit includes a scan register adapted for forming a scan chain with the scan registers of the other BIST circuits such that bits representing comparison results can be shifted through the scan chain.

5. The integrated circuit of claim 1, wherein the test circuit includes a built-in-self-test (BIST) circuit.

6. The integrated circuit of claim 1, wherein the tri-state buffer is adapted to respond to a write enable signal.

7. The integrated circuit of claim 1, wherein the tri-state buffer is adapted to respond to an initialization signal.

8. The integrated circuit of claim 1, wherein the test circuit includes an XOR gate adapted for comparing test vectors from the first bus to the test vectors read back from the selected embedded memories in the array.

9. The integrated circuit of claim 8, wherein the XOR gate comprises a plurality of XOR gates.

10. The integrated circuit of claim 9, wherein the test circuit further includes a wired NOR circuit to collapse outputs from the plurality of XOR gates into a single comparison result bit.

11. An integrated circuit, comprising:
a first bus;
at least one array of embedded memories;
a bidirectional data bus coupled to the array of embedded memories and to the first bus such that test vectors may be written from the first bus to selected embedded memories in the array through the bidirectional data bus;
a test circuit configured to compare test vectors on the first bus to test vectors read back from the selected embedded memories in the array through the bidirectional data bus to provide a comparison result; and
a tri-state buffer coupled between the first bus and the bidirectional bus, the tri-state buffer adapted to being driven into a high-impedance mode while test vectors are read from the embedded memories,
wherein the first bus is adapted for carrying local address signals such that test vectors written from the first bus to the embedded memories are written to the locations specified by the local address signals, the embedded memories being operable to respond to a global address signal identifying a particular embedded memory such that only the embedded memory identified by the global address signal is written to at the address specified by the local address signal.

12. The integrated circuit of claim 11, wherein the first bus is a directional bus.

13. The integrated circuit of claim 11 including a plurality of arrays of embedded memories and associated test circuits, wherein each test circuit includes a built-in-self-test (BIST) circuit and each BIST circuit includes a scan register adapted for forming a scan chain with the scan registers of the other BIST circuits such that bits representing comparison results can be shifted through the scan chain.

14. The integrated circuit of claim 11, wherein the tri-state buffer is adapted for responding to at least one of a write enable signal and an initialization signal.

* * * * *